United States Patent
Herrell et al.

(10) Patent No.: US 6,191,479 B1
(45) Date of Patent: Feb. 20, 2001

(54) DECOUPLING CAPACITOR CONFIGURATION FOR INTEGRATED CIRCUIT CHIP

(75) Inventors: Dennis J. Herrell, Marble Falls, TX (US); Mathias Boettcher, Dresden (DE)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/249,988

(22) Filed: Feb. 13, 1999

(51) Int. Cl.[7] .................................................. H01L 23/34
(52) U.S. Cl. ........................ 257/724; 257/532; 257/533
(58) Field of Search .............................. 257/532, 533, 257/534, 535, 306, 309, 295, 672, 530, 724; 361/301.2, 306.2, 307

(56) References Cited

U.S. PATENT DOCUMENTS

| | | | |
|---|---|---|---|
| 3,880,493 | 4/1975 | Lockhart, Jr. ........................ | 439/525 |
| 4,322,778 | 3/1982 | Barbour et al. ...................... | 361/794 |
| 4,636,918 | 1/1987 | Jodoin ................................. | 361/773 |
| 4,754,366 | 6/1988 | Hernandez .......................... | 361/306.2 |
| 4,982,311 | 1/1991 | Dehaine et al. ..................... | 361/708 |
| 4,994,936 | 2/1991 | Hernandez ......................... | 361/306.2 |
| 5,034,850 | 7/1991 | Hernandez et al. ................ | 361/306.2 |
| 5,049,979 | 9/1991 | Hashemi et al. .................... | 257/723 |
| 5,212,402 | 5/1993 | Higgins, III ........................ | 257/532 |
| 5,258,575 | 11/1993 | Beppu et al. ........................ | 174/52.4 |
| 5,266,821 | 11/1993 | Chern et al. ........................ | 257/312 |
| 5,307,309 | * 4/1994 | Protigal et al. ..................... | 365/63 |
| 5,366,931 | 11/1994 | Kim ..................................... | 438/123 |
| 5,472,900 | 12/1995 | Vu et al. .............................. | 438/396 |
| 5,475,565 | 12/1995 | Bhattacharyya et al. ........... | 361/719 |
| 5,508,881 | * 4/1996 | Stevens .............................. | 361/305 |
| 5,557,502 | 9/1996 | Banerjee et al. .................... | 361/712 |
| 5,583,739 | 12/1996 | Vu et al. .............................. | 361/313 |
| 5,625,221 | 4/1997 | Kim et al. ........................... | 257/686 |
| 5,633,785 | * 5/1997 | Parker et al. ........................ | 361/766 |
| 5,635,741 | * 6/1997 | Tsu et al. ............................ | 257/310 |

(List continued on next page.)

OTHER PUBLICATIONS

IEEE International Workshop on Chip Package Co–Design CPD, ETH Zürich, Switzerland, Mar. 24–26, 1998, pp. 4–5 and 46–47.

IEEE International Workshop on Chip Package Co–Design, "Fabrication methods and applications of the 'Stealth' decoupling capacitor" (Abstract), Zürich, Switzerland, Mar. 24–26, 1998 (2 pages).

IEEE Microwave Theory and Techniques Society, "7th Topical Meeting on Electrical Performance of Electronic Packaging EPEP '98", West Point, New York, Oct. 26–28, 1998, pp. 1 and 2, including seventeen (17) pages of slides.

*Primary Examiner*—Olik Chaudhuri
*Assistant Examiner*—Nathan W. Ha
(74) *Attorney, Agent, or Firm*—Zagorin, O'Brien & Graham, LLP (57) ABSTRACT

A decoupling capacitor structure formed integral with an integrated circuit chip and over top of circuitry defined thereon advantageously provides decoupling capacitance in close electrical proximity to switching circuits of the integrated circuit chip without substantially affecting die footprint. In contrast with on-die gate oxide capacitor configurations, a decoupling capacitor structure formed toward the back end of processing, typically after interconnect metal, allows large area capacitor structures without substantial impact on area available for devices and circuitry. Inductance associated with the intervening portion of a power supply loop circuit between switching circuits of the integrated circuit chip and the decoupling capacitor structure can be extremely low in configurations in accordance with the present invention. In some configurations, connection points, e.g., bonding pads and/or solder bumps for conveying power supply voltages, are defined over top of the decoupling capacitor structure.

37 Claims, 7 Drawing Sheets

U.S. PATENT DOCUMENTS

| | | | |
|---|---|---|---|
| 5,668,399 | * 9/1997 | Cronin et al. | 257/532 |
| 5,731,960 | 3/1998 | Fung | 361/782 |
| 5,739,576 | 4/1998 | Shirley et al. | 257/532 |
| 5,793,076 | * 8/1998 | Fazan et al. | 257/298 |
| 5,856,937 | * 1/1999 | Chu et al. | 365/51 |
| 5,864,177 | * 1/1999 | Sundstrom | 257/723 |

* cited by examiner

DECOUPLING CAPACITOR CONFIGURATION FOR INTEGRATED CIRCUIT CHIP

BACKGROUND OF THE INVENTION

1. Field of the Invention

This invention relates to power distribution system design, and in particular to managing disturbances otherwise caused by time varying current demands in an integrated circuit.

2. Description of the Related Art

As high performance integrated circuits demand larger currents at higher frequencies with lower power supply voltages, power system design becomes increasingly challenging. For example, next generation microprocessors will demand peak currents in excess of 100 A and reach operating frequencies of 1 GHz with power supply voltages below 2 V. At such current levels, surge currents and associated excitations of power distribution system resonances can result in significant power supply voltage excursions. Accordingly, reductions in the AC impedance of a power distribution system, particularly inductive components thereof, are desired.

A variety of techniques are available to improve the AC impedance characteristics of a power distribution system. One such technique involves the appropriate placement of decoupling structures/devices, e.g., capacitors, throughout the power distribution system. Others include chip layout with respect to power distribution, use of low inductance packaging technologies such as Controlled Collapse Chip Connection (C4) and Ball Grid Array (BGA) for delivery of supply voltages ($V_{DD}$ and $V_{SS}$), BGA package design and layers, card layout and use of discrete capacitance placed thereon, connector selection and $V_{DD}/V_{SS}$ allocations, regulator choice, and lastly the motherboard layout.

In a typical computer system configuration, inductances are associated with the vias, traces, connectors, etc. of an integrated circuit carrier (or "package"), of a daughterboard card, and of a motherboard. At low frequencies (i.e., below approximately 100 KHz), impedance of the power supply loop circuit can be made arbitrarily low through the utilization of feedback voltage sensing at the power supply. At very high frequencies, the impedance of the power supply loop circuit can be lowered with the use of on-die capacitance to approximately $(1/\omega C)$ where $\omega$ is the angular frequency (such that $\omega=2\pi f$) and C is the capacitance associated with the power supply loop circuit including the on-die capacitance. Unfortunately, in the mid-frequencies (e.g., from approximately 1 MHz to 100 MHz), the AC impedance of the power supply loop circuit is likely to exhibit resonances.

While the impedance at both high- and mid-frequencies can be managed through the use of decoupling capacitors placed strategically in the power supply loop circuit, two significant challenges exist. First, spatial limitations of an integrated circuit chip can limit the amount of capacitance provided on-die. Typically, only the portions of the die that are free from device structures will be available for fabrication of on-die capacitors. High-frequency, high-current integrated circuits such as advanced microprocessors may require hundreds of nF of on-die capacitance. Even worse, larger capacitances, e.g., $\mu f$, will be required to manage mid-frequency resonances. Using conventional gate oxide dielectric techniques and typical gate oxide thicknesses, capacitance on the order of 10 nF per $mm^2$ can be achieved. Therefore, achieving hundreds to thousands of nF of on-die capacitance requires significant die footprint (e.g., tens to hundreds of $mm^2$). Such die footprint can adversely affect die size and yield.

Many off-chip decoupling capacitor configurations have been developed. For example, U.S. Pat. No. 4,754,366 to Hernandez discloses flat decoupling capacitors adapted for mounting directly under a Pin Grid Array (PGA) package, directly under a surface-mounted Plastic Leaded Chip Carrier (PLCC), and over a surface-mounted leadless chip carrier. U.S. Pat. No. 4,636,918 to Jodoin and U.S. Pat. No. 5,034,850 to Hernandez et al. disclose other discrete off-chip decoupling capacitor configurations. Unfortunately, the inductive impedance of intervening portions of the power supply loop circuit (e.g., of chip and package -level interconnect features such as vias, traces, bonding pads, wires and wire bonds, Tape Automated Bonded (TAB) traces and bonds, solder bumps including Controlled Collapse Chip Connection (C4) bumps, etc.) typically limits the efficacy of off-chip decoupling capacitors.

In part for this reason, decoupling capacitors have also been provided integral with an integrated circuit package. For example, U.S. Pat. No. 5,258,575 to Beppu et al. discloses a plurality of small discrete decoupling capacitors connected to integral power and ground planes of an integrated circuit package. U.S. Pat. No. 5,475,565 to Bhattacharyya et al. discloses a decoupling capacitor configuration wherein the decoupling capacitor is mounted to and electrically connected to a lid of an electronic package. U.S. Pat. No. 5,049,979 to Hashemi et al. discloses a close attach capacitor attached above the top of a TAB chip wherein short bonded wires or TAB leads interconnect the capacitor electrodes with power and ground pads on the chip.

Unfortunately, even in such configurations, the series inductance from the switching circuits of the integrated circuit to the decoupling capacitance limits the efficacy of the decoupling capacitance. Accordingly, decoupling capacitor configurations are desired which allow placement of large decoupling capacitance on-die with extremely low intervening inductance.

SUMMARY

A decoupling capacitor structure formed integral with an integrated circuit chip and over top of circuitry defined thereon advantageously provides decoupling capacitance in close electrical proximity to switching circuits of the integrated circuit chip without substantially affecting die footprint. In contrast with on-die gate oxide capacitor configurations, a decoupling capacitor structure formed toward the back end of processing, typically after interconnect metal, allows large area capacitor structures without substantial impact on area available for devices and circuitry. Inductance associated with the intervening portion of a power supply loop circuit between switching circuits of the integrated circuit chip and the decoupling capacitor structure can be extremely low in configurations in accordance with the present invention. In some configurations, connection points, e.g., bonding pads and/or solder bumps for conveying power supply voltages, are defined over top of the decoupling capacitor structure.

In some embodiments in accordance with the present invention, an integrated circuit chip includes circuitry defined thereon including device structures and conductive traces and a thin-film capacitor formed over the circuitry and electrically coupled thereto. In some configurations, the integrated circuit chip also includes conductive vias formed at least partially through the thin-film capacitor from respective of the conductive traces. Each of a first group of the conductive vias is electrically connected to a first conductive plate of the thin-film capacitor and perforates, without connecting to, a second conductive plate of the thin-film capacitor. Each of a second group of the conductive vias is electrically connected to the second conductive plate. In some configurations, the integrated circuit chip also includes plural connection points defined thereon, wherein at least a portion of the first group of conductive vias extend to respective connection points, and wherein at least a portion of the second group of conductive vias perforate, without connecting to, the first conductive plate and extend to respective connection points. In some configurations, a third group of conductive vias is formed through said thin-film capacitor from respective of the connection points to respective signal voltage conveying conductive traces. The third conductive vias perforate, without connecting to, conductive plates of the thin-film capacitor. In some configurations, power supply voltages are introduced to the circuitry of the integrated circuit chip via the thin-film capacitor. In others, power supply voltages are introduced independent of the thin-film capacitor.

In some embodiments in accordance with the present invention, an integrated circuit chip includes circuitry defined thereon, a thin-film capacitor structure defined over the circuitry and plural connection points defined over the thin-film capacitor, wherein said thin-film capacitor is interposed between the conductive traces and the connection points. In some configurations, the thin-film capacitor structure is substantially coextensive with a surface of the integrated circuit chip.

In some embodiments in accordance with the present invention, a thin-film capacitor is formed on-chip, whereas in others, a thin-film capacitor is included as part of a package configuration for receiving an integrated circuit chip. In either case, electric coupling between the thin-film capacitor and circuits of an integrated circuit chip provides an extremely low inductance electrical pathway therebetween.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
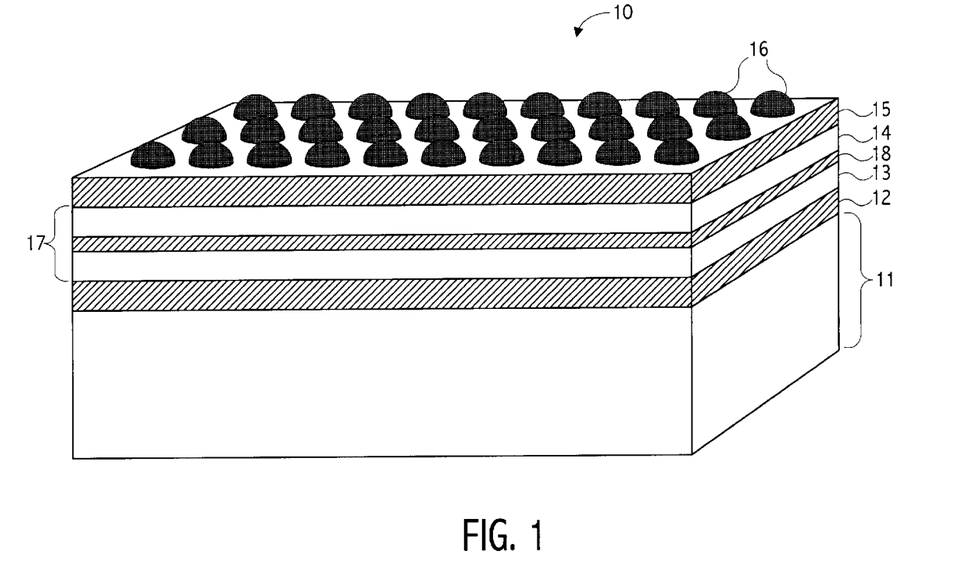
FIG. 1 illustrates an on-chip decoupling capacitor configuration in accordance with an exemplary embodiment of the present invention.

Referring now to FIG. 1, an on-chip decoupling capacitor configuration is shown wherein devices and conductors are defined in a circuitry portion 11 of an integrated circuit chip 10, solder bump connection points (e.g., solder bumps 16) are formed on an upper surface thereof, and a decoupling capacitor 17 is defined between circuitry portion 11 and decoupling capacitor 17. Circuitry defined by semiconductor devices, passives, metal layers, traces, vias, etc. of integrated circuit chip 10 exhibits switching behavior that tends to generate surge currents. Decoupling capacitor 17 stores and supplies charge to satisfy, at least in part, such surge current demands. As further described below, the configuration of FIG. 1 allows the introduction of a large area capacitor in very close electrical proximity to the switching circuits of integrated circuit chip 10. As a result, decoupling capacitor 17 can be effective in mitigating AC voltage noise even for extremely high frequency circuits and high peak currents. For example, such an on-hip decoupling capacitor configuration is particularly attractive for next generation microprocessors reaching operating frequencies of 0.5–1.0 GHz or more and demanding peak currents of 50–100 A or more.

An insulating layer 15 is formed between decoupling capacitor 17 and solder bumps 16 and conductive pads are defined on an upper surface of insulating layer 15 to receive solder bumps 16 for attachment to an integrated circuit package or board (not shown). Alternatively, an integrated circuit chip may be supplied with connection points (e.g., conductive pads) formed on an upper surface thereof to connect to corresponding connection features (e.g., solder bumps) on an integrated circuit package or board.

In an illustrative embodiment, connection points are distributed over a top surface of integrated circuit chip 10 and above decoupling capacitor 17 as shown in FIG. 1. It is noted that in the illustrated two electrode embodiment of decoupling capacitor 17, conductive layers 13 and 14 couple to respective ones of solder bumps 16. In some configurations, substantially all of solder bumps 16 are allocated to delivery of first and second power supply voltages to the circuits of integrated circuit chip 10 via decoupling capacitor 17. In such configurations, other connection points (e.g., other solder bumps, wire bond pads, TAB bond pads, etc.) are provided for conveying signal voltages. In other configurations, some of solder bumps 16 are allocated to conveying signal voltages. In either case, individual ones of solder bumps 16 are electrically connected to a corresponding electrode of decoupling capacitor 17 (e.g., to conductive layer 13 or 14) via vias extending through insulating layer 15 to the corresponding electrode. Of those vias, roughly half of those allocated to delivery of power supply voltages perforate insulating layer 15 and electrically connect to conductive layer 14, while roughly the balance thereof perforate insulating layer 15, perforate conductive layer 14 (without connecting thereto) and electrically connect to conductive layer 13. Similarly, vias extend downward from conductive layers 13 and 14 to corresponding conductive traces and vias of a power distribution network within circuitry portion 11 of integrated circuit chip 10. Vias from conductive layer 14 perforate without connecting to conductive layer 13.

In still other configurations, substantially all of solder bumps 16 are allocated to conveying signal voltages. Individual ones of solder bumps 16 are electrically connected to conductive traces of a signal distribution network within circuitry portion 11 of integrated circuit chip 10 via vias extending through decoupling capacitor 17, perforating without connecting to conductive layers 13 and 14. Power supply voltages are introduced separately. For example, power supply voltages may be introduced via decoupling capacitor 17, e.g., by lateral conductive traces coupling power supply voltage connection points (not shown) to conductive layers 13 and 14, or directly to the power distribution network within circuitry portion 11 of integrated circuit chip 10. In either case, conductive layers 13 and 14 are electrically connected to corresponding portions of the power distribution network to provide the desired decoupling capacitance. Vias extend downward from conductive layers 13 and 14 to corresponding conductive traces and vias within circuitry portion 11 of integrated circuit chip 10. In an exemplary two power supply voltage embodiment, roughly half of those vias are allocated to each power-supply voltage. A first group of vias extends downward from conductive layer 14 through dielectric layer 18, perforating without connecting to conductive layer 13, while a second group extends downward from conductive layer 13.

In embodiments in accordance with FIG. 1, vias extend downward from conductive layers 13 and 14 to conductors defined in metal layers of a multi-layer metal integrated circuit design. By distributing large numbers of downward extending vias across the area defined by decoupling capacitor 17, the use of lateral traces can be reduced and intervening inductance between decoupling capacitor 17 and the switching circuits of integrated circuit chip 10. In some embodiments, upper vias extend downward from connection points defined on the surface of integrated circuit chip 10 to a respective conductive layer of decoupling capacitor 17 and continue downward (as lower vias) to electrically couple to respective portions a power supply voltage distribution network defined in metal lines, polysilicon, etc. of circuitry portion 11.

In other embodiments, lower via portions are provided to electrically couple conductive layers of decoupling capacitor 17 to respective portions of a power supply voltage distribution network defined in metal lines, polysilicon, etc. of circuitry portion 11 and power supply voltages are introduced separately. For example, power supply voltages may be supplied directly to the power supply voltage distribution network to which decoupling capacitor 17 is itself electrically coupled or by electrically coupling conductive layers 13 and 14 to externally supplied power supply voltages (e.g., laterally, from below, via other surface connection points not illustrated in FIG. 1 or otherwise independently of the illustrated connection points, solder bumps 16). Persons of ordinary skill in the art will appreciate a wide variety of suitable configurations based on the illustrative embodiments described herein.

In some embodiments, upper vias from connection points to conductive layers of decoupling capacitor 17 are disjoint from lower vias extending downward from conductive layers 13 and 14 to metal lines, polysilicon, etc. of a power supply voltage distribution network. In addition, via numbers, sizes and pitch may differ for via configurations of upper and lower vias. For example, smaller numbers of upper vias with larger cross-sectional area may be spaced in accordance with chip attach requirements (e.g., C4 bump pitch constraints); whereas larger numbers of lower vias with smaller cross-sectional area may be used to reduce intervening inductance between decoupling capacitor 17 and the switching circuits of integrated circuit chip 10. Furthermore, positioning of lower vias may be tailored somewhat independently of that for upper vias so as to coincide with circuit features positioned therebelow.

A wide variety of via and connection point configurations are suitable. However, for purposes of illustration and without limitation, one presently preferred configuration is as follows. Connection points include C4 bumps with a diameter of approximately 100 $\mu$m are arranged at a pitch of approximately 250 $\mu$m in a triangular close packing arrangement (e.g., in an equilateral triangle arrangement approximately 250 $\mu$m on a side). At such spacing, it is possible to get approximately 46 rows of 40 C4 connection points (or 1840 C4 bumps) distributed over a 1 cm$^2$ integrated circuit chip. Via pitch to the devices and circuits of integrated circuit chip 10 can be $\frac{1}{10}$ or $\frac{1}{100}$ of C4 pitch. As a result, and to provide extremely low intervening inductance between decoupling capacitor 17 and the switching circuits of integrated circuit chip 10, very large numbers of lower vias, conceivably 10s of thousands to 10s of millions, may be employed. In other embodiments, e.g., in some conjoint upper and lower via embodiments illustrated herein, much smaller numbers of vias may be employed. For example, single via per connection point embodiments are contemplated. Alternatively, multiple upper per connection point vias (and lower vias, if conjoint) may be employed. Antiparallel arrangements of vias for conveying complementary power supply voltages may be employed to further reduce inductance. Persons of ordinary skill in the art will recognize a variety of suitable variations based on the forgoing description and that of several illustrative via configurations now described with reference to FIGS. 3A, 3B, 4A, 4B, 9A, 9B, 10A and 10B.

Figure 3A:
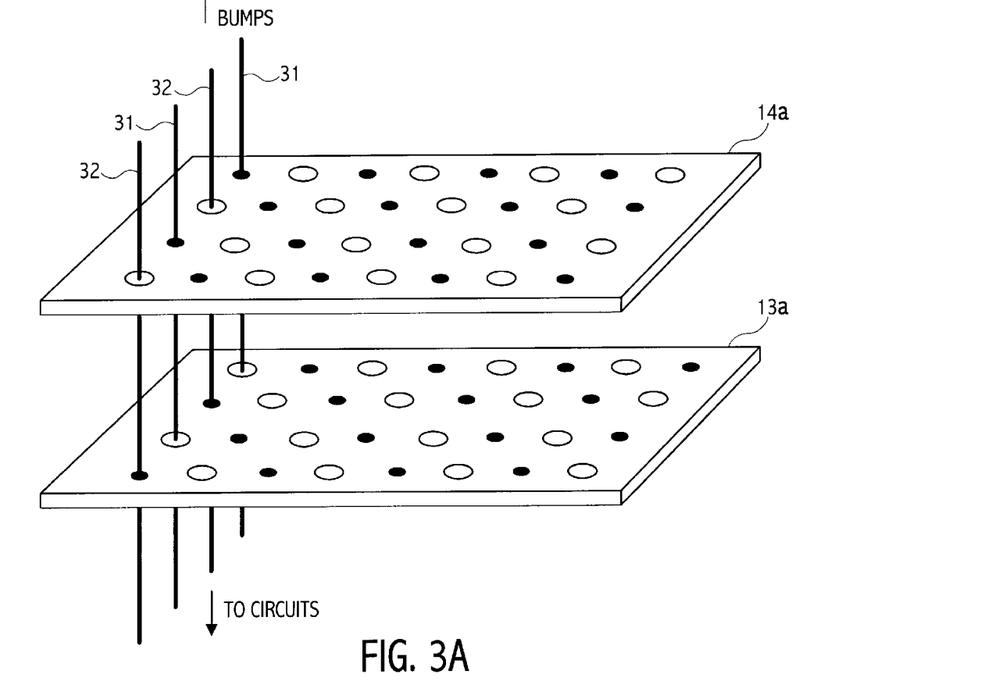
FIGS. 3A and 3B depict an exploded perspective view illustration and a top view, respectively, of a decoupling capacitor configuration in accordance with an exemplary embodiment of the present invention
Figure 3B:
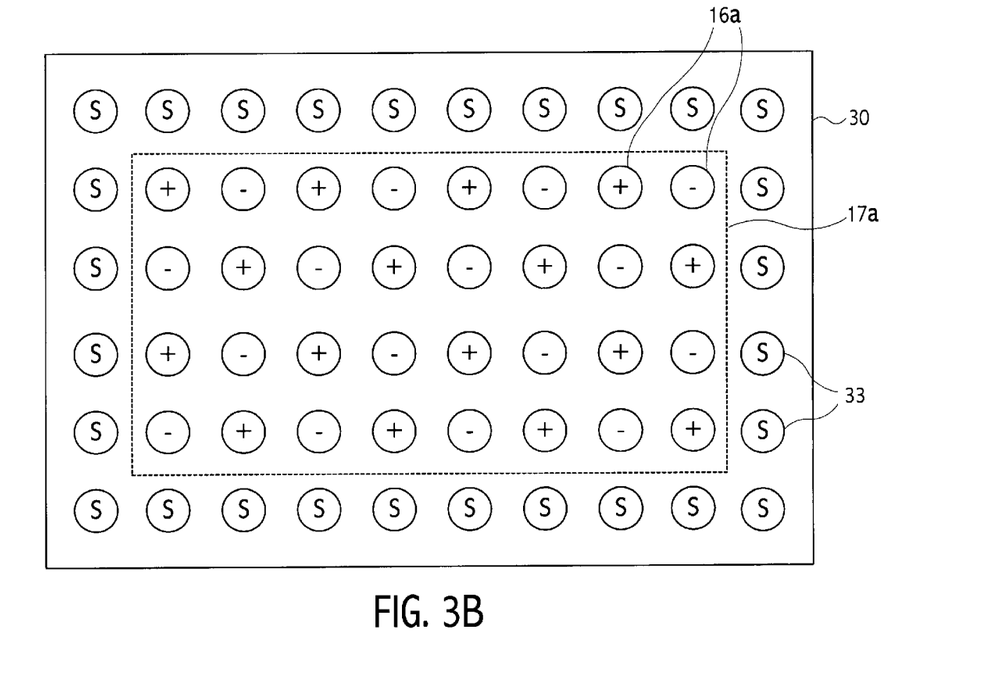

FIGS. 3A and 3B depict an exploded perspective view and a top plan view of an illustrative portion of an exemplary decoupling capacitor configuration in accordance with the present invention. Dielectric, connection points, metal layers, switching circuits and substrate of integrated circuit chip 30 are omitted for clarity in FIG. 3A. An upper conductive layer 14a and lower conductive layer 13a of decoupling capacitor 17a are respectively associated with first and second power supply voltages. Vias 31 convey the first power supply voltage and connect with upper conductive layer 14a. Vias 31 then continue downward perforating without connecting to lower conductive layer 13a toward switching circuits of integrated circuit chip 30. Similarly, vias 32 convey the second power supply voltage, perforating without connecting to upper conductive layer 14a. Vias 32 connect with lower conductive layer 13a and continue downward toward switching circuits of integrated circuit chip 30.

As illustrated in FIG. 3B, power supply voltage connection points (e.g., solder bumps 16a) are arrayed above decoupling capacitor 17a and couple to respective vias (e.g., vias 31 and 32) defined in integrated circuit chip 30. Signal connection points (e.g., solder bumps 33) are arrayed around the periphery of integrated circuit chip 30 and (in the embodiment of FIG. 3B) are defined outside the area of decoupling capacitor 17a. Although power supply voltage connection points are illustrated as solder bumps in FIG. 3B, a wide variety of other connection point designs are also suitable. For example, connection points may include bonding pads to connect with corresponding features (e.g., solder bumps) defined on a surface of an integrated circuit package, card or board. In addition, C4 technology based or other solder or metal reflow based surface connection point technologies are suitable.

Figure 4A:
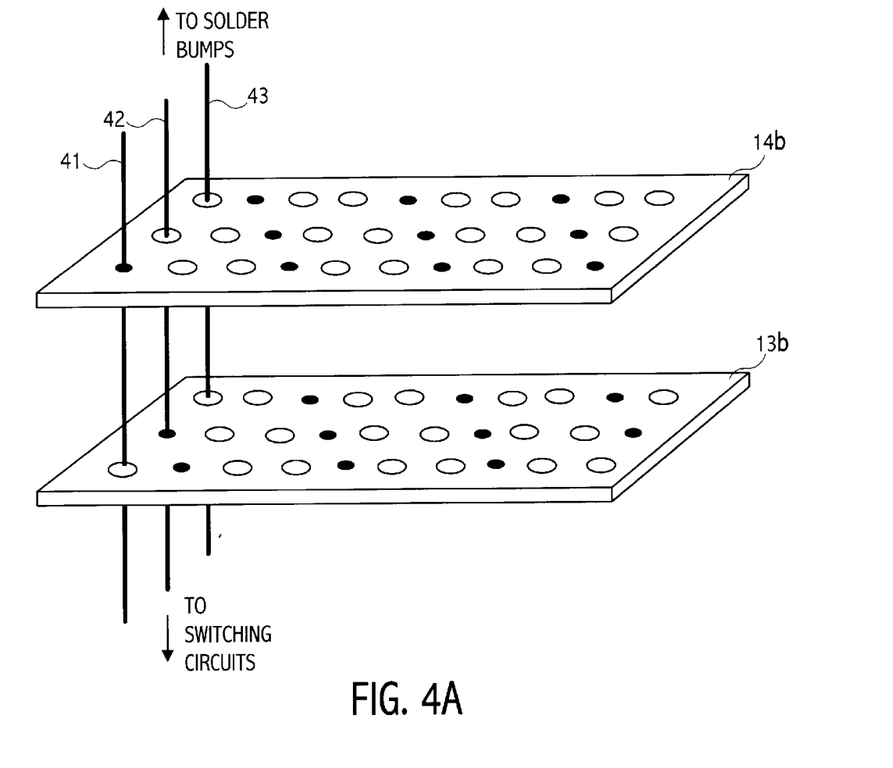
FIGS. 4A and 4B depict an exploded perspective view illustration and a top view, respectively, of another decoupling capacitor configuration in accordance with an exemplary embodiment of the present invention.
Figure 4B:
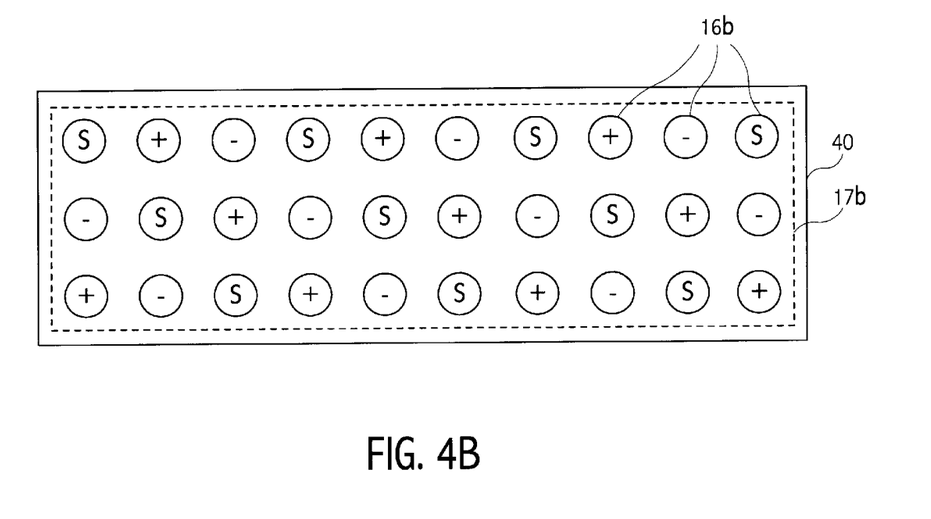

Referring now to FIGS. 4A and 4B, an exploded perspective view and a top plan view of an illustrative portion of another decoupling capacitor configuration are illustrated in accordance with the present invention. As before, dielectric, connection points, metal layers, switching circuits and substrate of integrated circuit chip 30 are omitted for clarity. Vias such as via 41 convey the first power supply voltage and connect with upper conductive layer 14b. Via 41 then continues downward perforating without connecting to lower conductive layer 13b toward switching circuits of integrated circuit chip 40. Similarly, vias such as via 42 convey the second power supply voltage, perforating without connecting to upper conductive layer 14b. Via 42 connects with lower conductive layer 13b and continues downward toward switching circuits of integrated circuit chip 40. Unlike the configuration of FIGS. 3A and 3B, both power supply voltage and signal connection points (e.g., solder bumps 16b) are arrayed above decoupling capacitor 17b. In particular, signal vias (e.g., via 43) perforate without connecting to either upper conductive layer 14b or lower conductive layer 13B and continue downward toward the switching circuits of integrated circuit chip 40.

Figure 9A:
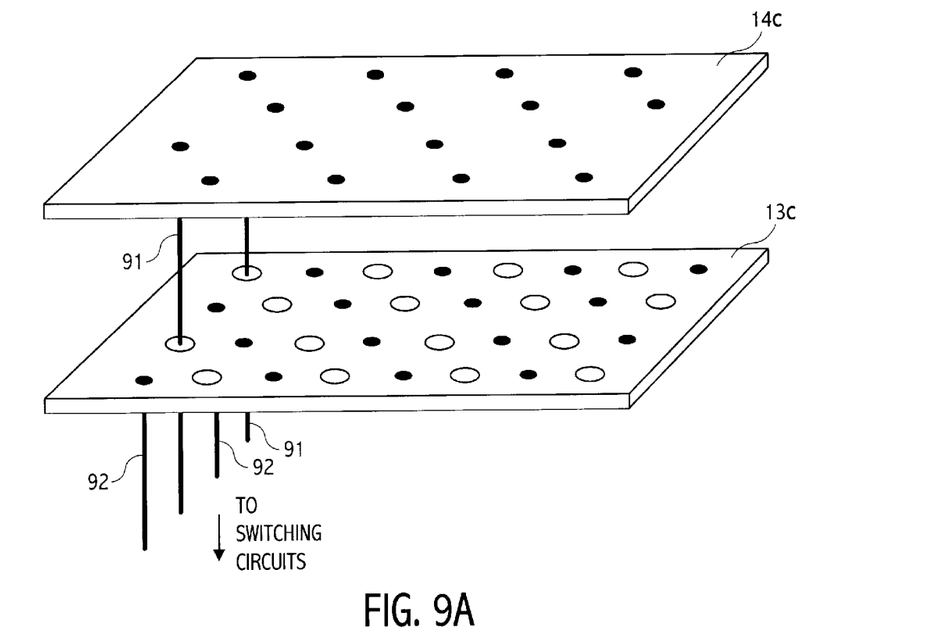
FIGS. 9A and 9B depict an exploded perspective view illustration and a top view, respectively, of yet another decoupling capacitor configuration in accordance with an exemplary embodiment of the present invention.
Figure 9B:
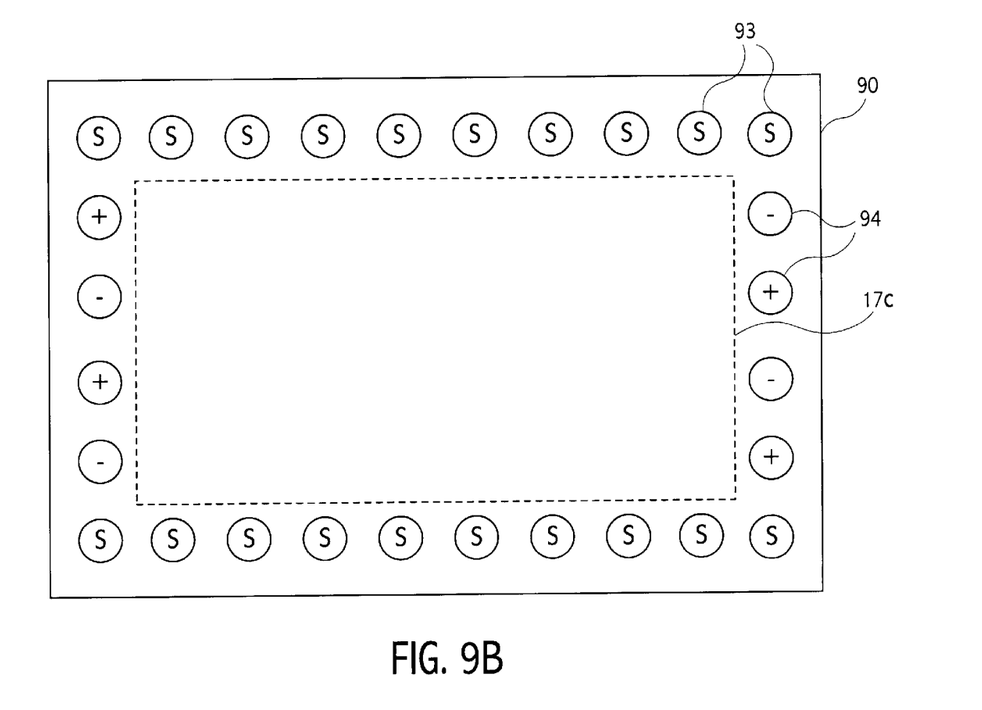

Referring now to FIGS. 9A and 9B, an exploded perspective view and a top plan view of an illustrative portion of yet another decoupling capacitor configuration are illustrated in accordance with the present invention. As before, dielectric, connection points, metal layers, switching circuits and substrate of integrated circuit chip 90 are omitted for clarity. Power supply voltage introduction may be direct to the switching circuits of integrated circuit chip 90 or laterally (connections not shown) to conductive layers 13c and 14c of decoupling capacitor 17c (e.g., via power supply voltage connection points such as connection points 94) rather than via vias extending from connection points arrayed above the decoupling capacitor as illustrated in the configurations of FIGS. 3A, 3B, 4A and 4B. In the configuration of FIGS. 9A and 9B, vias such as vias 91 connect upper conductive layer 14c to corresponding first power supply voltage conveying portions of a power supply voltage distribution network. Similarly, vias such as vias 92 connect lower conductive layer 13c to corresponding second power supply voltage conveying portions of the power supply voltage distribution network. It is noted that vias 91 perforate without connecting to lower conductive layer 13c. Because vias 91 and 92 do not extend downward from connection points arrayed on the surface of integrated circuit chip 90, via pitch may be much finer than if constrained by solder bump pitch. As a result, extremely large numbers of vias (e.g., 10s of thousands to 10s of millions) may be provided in some embodiments.

Figure 10A:
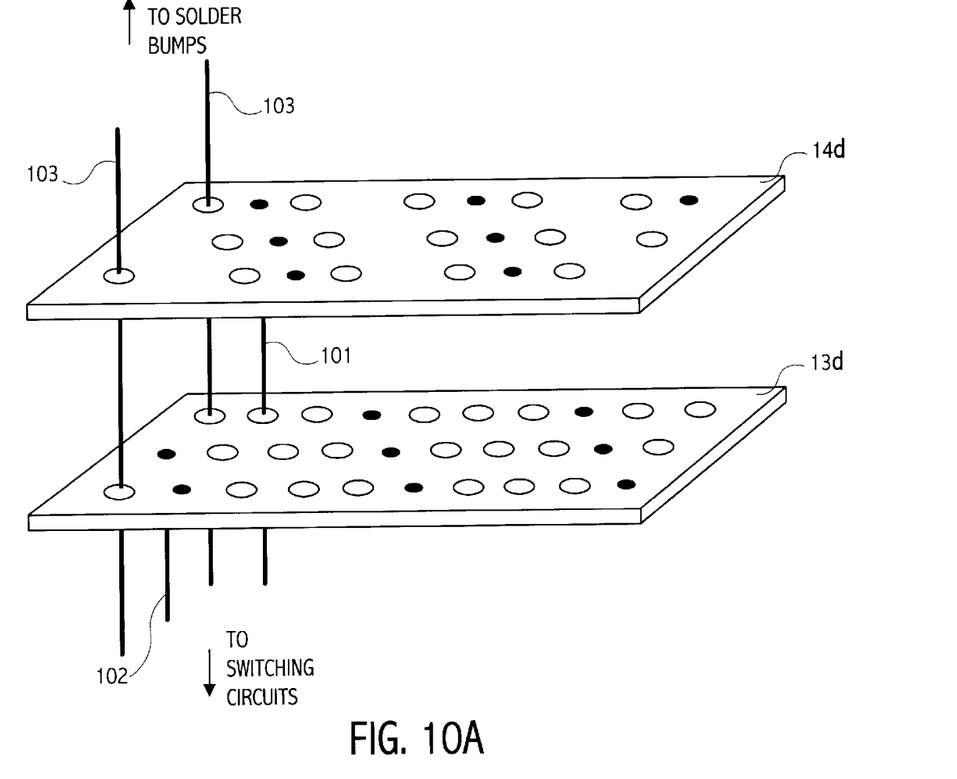
FIGS. 10A and 10B depict an exploded perspective view illustration and a top view, respectively, of still yet another decoupling capacitor configuration in accordance with an exemplary embodiment of the present invention The use of the same reference symbols in different drawings indicates similar or identical items.
Figure 10B:
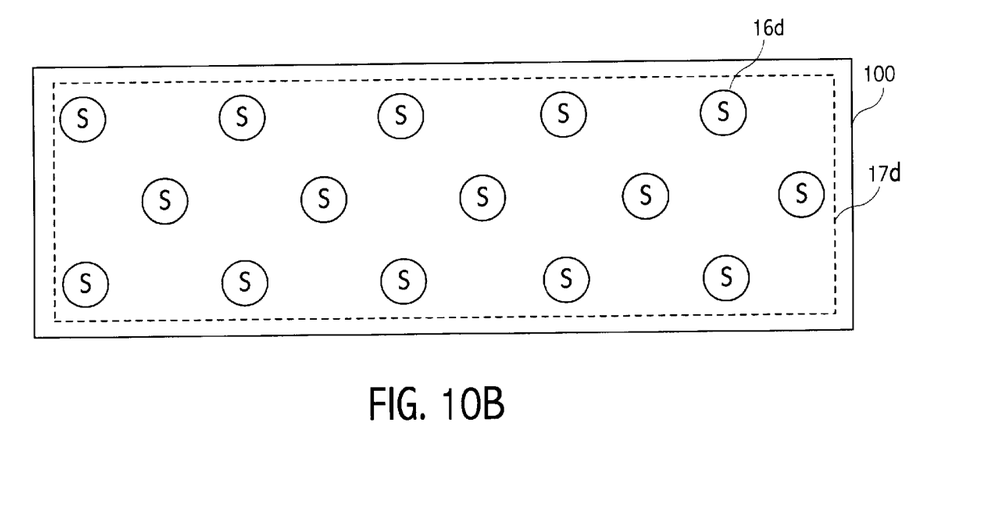

Referring now to FIGS. 10A and 10B, an exploded perspective view and a top plan view of an illustrative portion of still yet another decoupling capacitor configuration are illustrated in accordance with the present invention. As before, power supply voltage introduction may be direct to the switching circuits of integrated circuit chip 100 or laterally to conductive layers 13d and 14d of decoupling capacitor 17d (e.g., via power supply voltage connection points not shown) rather than via vias extending from connection points arrayed above the decoupling capacitor as illustrated in the configurations of FIGS. 3A, 3B, 4A and 4B. In the configuration of FIGS. 10A and 10B, vias such as via 101 connect upper conductive layer 14d to corresponding first power supply voltage conveying portions of a power supply power distribution network. Similarly, vias such as via 102 connect lower conductive layer 13d to corresponding second power supply voltage conveying portions of the power supply voltage distribution network. Unlike the configuration of FIGS. 9A and 9B, signal connection points (e.g., solder bumps 16d) are arrayed above decoupling capacitor 17d. In particular, signal vias (e.g., vias 103) perforate without connecting to either upper conductive layer 14d or lower conductive layer 13d and continue downward toward the switching circuits of integrated circuit chip 100. Power supply voltage vias 101 extend downward from upper conductive layer 14d, perforating without connecting to lower conductive layer 13d. As before, pitch for vias 101 and 102 may be much finer than if constrained by solder bump pitch. However, unlike the configuration of FIGS. 9A and 9B, suitable arrangements of vias 101 and 102 are constrained by the placement of signal voltage conveying vias 103.

For ease of illustration, small numbers of connection points have been illustrated in various of the drawings. However, persons of ordinary skill in the art will appreciate that large numbers of connection points are also envisioned, particularly for high frequency, high current integrated circuit (e.g., microprocessor) implementations. In particular, very large numbers (e.g., 100s or 1000s) of power supply voltage connection points may be employed. As a result, even in decoupling capacitor configurations in accordance with the present invention wherein signal connection points are arrayed around the periphery of an integrated circuit chip and defined outside the area of an on-chip decoupling capacitor, such an on-chip capacitor can extend over a substantial entirety of the surface of the integrated circuit chip.

Figure 2:
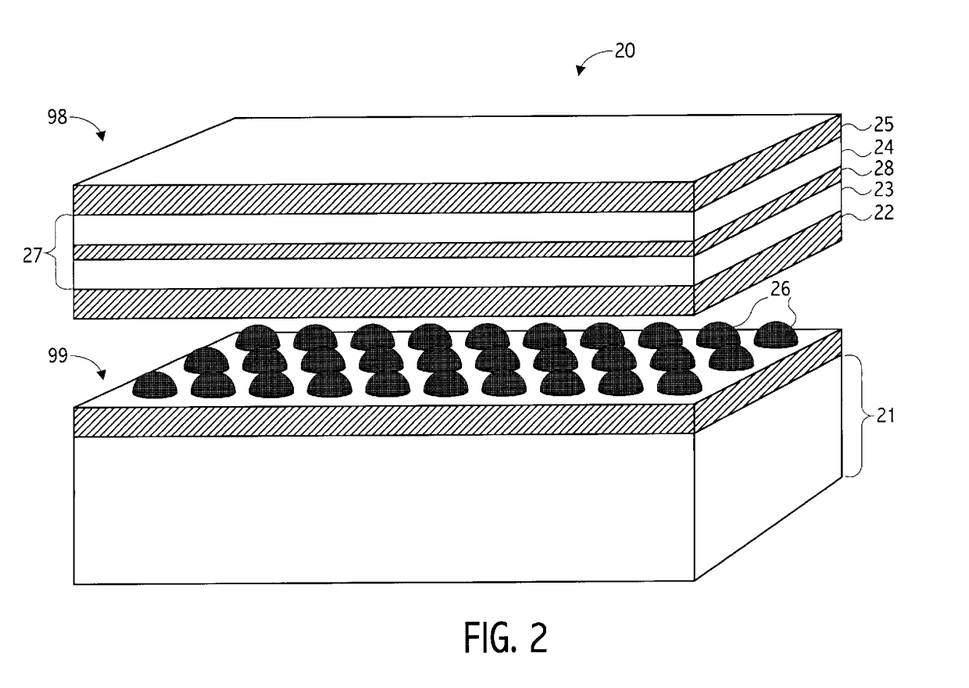
FIG. 2 illustrates a package configuration for a decoupling capacitor in accordance with an exemplary embodiment of the present invention.

Referring now to FIG. 2, an alternative package configuration 20 is illustrated for a decoupling capacitor 98 employing some of the design features previously described but configured for attachment to an integrated circuit chip 99. As before, devices and conductors are defined in a circuitry portion 21 of integrated circuit chip 99 and solder bump connection points (e.g., solder bumps 26) are defined on an upper surface thereof. Corresponding connection points are defined on a lower surface (not shown) of decoupling capacitor 98.

In the illustrated two electrode embodiment of decoupling capacitor 27, conductive layers 23 and 24 couple to respective ones of solder bumps 26 associated with first and second power supply voltages. In some configurations, substantially all of solder bumps 26 are allocated to delivery of first and second power supply voltages to the circuits of integrated circuit chip 99 via decoupling capacitor 27. In such configurations, other connection points (e.g., other solder bumps, wire bond pads, TAB bond pads, etc.) are provided for conveying signal voltages. In other configurations, some of solder bumps 26 are allocated to conveying signal voltages. In either case, individual ones of solder bumps 26 are electrically connected to a corresponding electrode of decoupling capacitor 27 (e.g., to conductive layer 23 or 24) via vias extending through insulating layer 22 to the corresponding electrode.

Figure 5A:
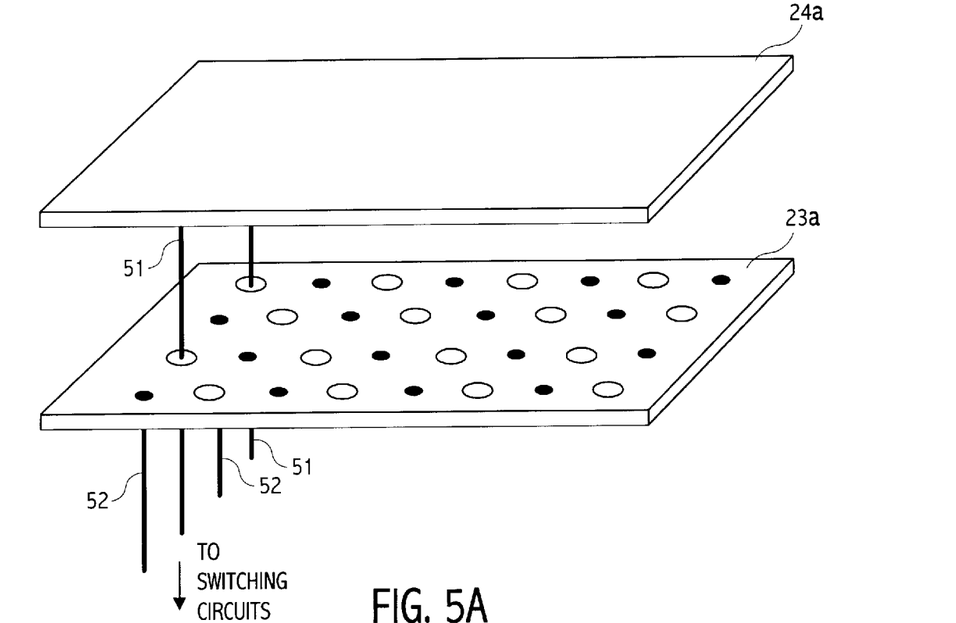
FIG. 5A depicts an exploded perspective view illustration of an exemplary package decoupling capacitor configuration in accordance with an exemplary embodiment of the present invention.
Figure 5B:
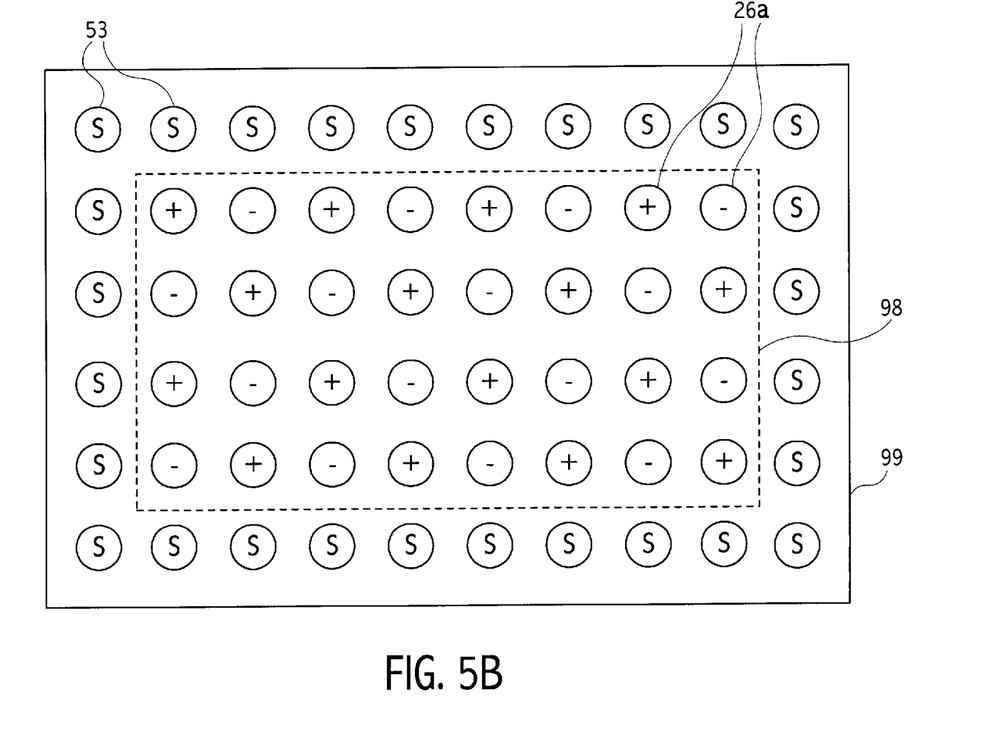
FIG. 5B depicts a top view of an exemplary integrated circuit chip configured to receive the package decoupling capacitor of FIG. 5A.

An exemplary embodiment in accordance with a package configuration of decoupling capacitor 27 is illustrated in FIGS. 5A and 5B. Dielectric, connection points, metal layers, switching circuits and substrate of integrated circuit chip 99 are omitted for clarity. Vias 51 connect with upper conductive layer 24a and convey the first power supply voltage downward toward switching circuits of integrated circuit chip 99. Vias 51 perforate without connecting to lower conductive layer 23a. Vias 52 connect with lower conductive layer 23a and convey the second power supply voltage toward switching circuits of integrated circuit chip 99.

As illustrated in FIG. 5B, power supply voltage connection points (e.g., solder bumps 26a) are arrayed on an upper surface of integrated circuit chip to mate with connection pads corresponding to vias 51 and 52. Signal connection points (e.g., solder bumps 53) are arrayed around the periphery of integrated circuit chip 99. In the embodiment of FIG. 5B, decoupling capacitor 98 of an integrated circuit package is aligned above power supply voltage conveying connection points of integrated circuit chip 99. Signal voltages are coupled to the integrated circuit package through other connection points (not shown). In other embodiments, signal and power supply voltage connection points may be arrayed on an integrated circuit chip as shown in FIG. 4B and correspondingly on a lower surface of a package configuration decoupling capacitor such as 98 with signal vias perforating but not connecting to upper conductive layer 24a or lower conductive layer 23a. Although solder bumps such C4-type solder bumps are presently preferred as a connection mechanism for both power supply voltage and signal connection, mixed type connections (e.g., solder bumps for conveying power supply voltage from package to chip and wire bond or TAB pads for conveying signal voltages) may also be employed.

Upper conductive layer 24a or lower conductive layer 23a may couple out to external portions of the power supply loop circuit using any of a variety of suitable methods. For example, the conductive layers may couple out laterally, upward or downward at the periphery thereof, or upward through an upper surface of decoupling capacitor 98 as previously illustrated with respect to on-chip decoupling capacitor embodiments.

Figure 6:
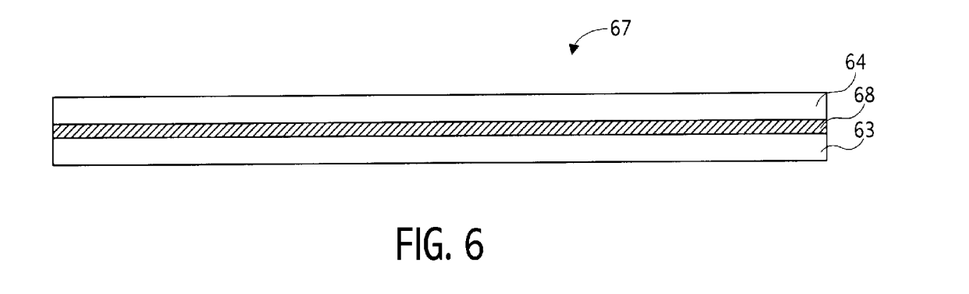
FIGS. 6, 7 and 8 depict illustrative cross-sectional views of exemplary electrode configurations for decoupling capacitor configurations fabricated in accordance with exemplary embodiments of the present invention.
Figure 7:
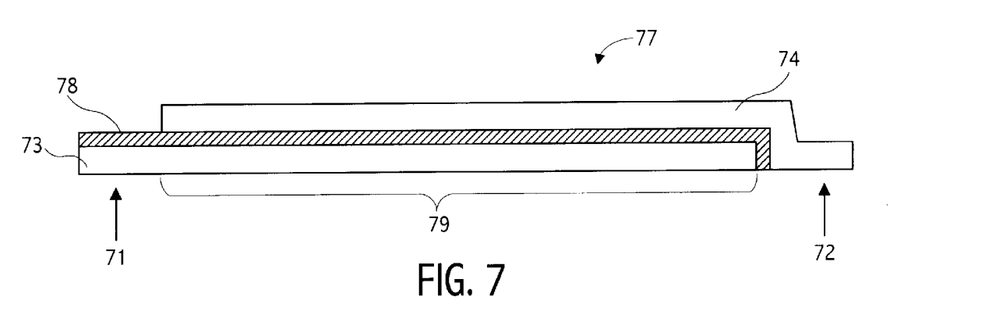
Figure 8:
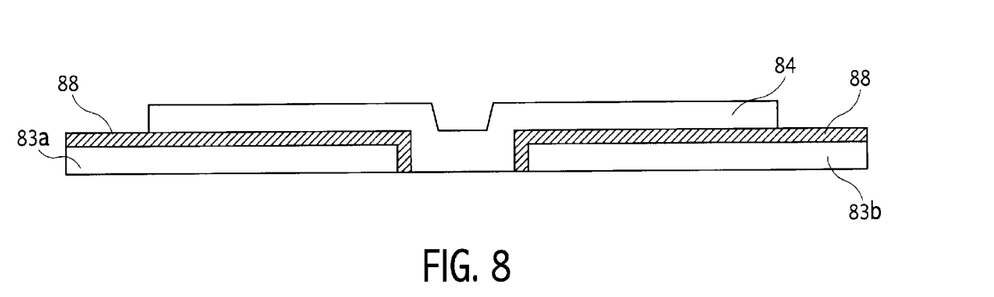

FIGS. 6, 7 and 8 depict a number of exemplary decoupling capacitor structures. FIG. 6 depicts a typical layer configuration with metal layers 64 and 63 having a dielectric disposed therebetween. In such a configuration, essentially all of the surface area of decoupling capacitor 67 is suitable for placement of surface connection points, including first and second power supply voltage connection points, and in certain embodiments signal voltage connection points. FIG. 7 depicts an alternative decoupling capacitor structure that advantageously provides for bottom surface coupling out to a power supply loop circuit at a periphery (e.g., at 71 and 72) of decoupling capacitor 77. Alternatively, with etch of a portion of layer 78, top surface coupling out to a power supply loop circuit at a periphery of decoupling capacitor 77 is possible. A substantial entirety 79 of decoupling capacitor 77 is suitable for placement of surface connection points, including first and second power supply voltage connection points and signal voltage connection points as described hereinabove. Finally, a bottom electrode can be patterned as separate pieces 83a and 83b such that one part can be coupled to one power supply voltage and the other part coupled to the complementary part of the supply (such as the ground supply). In this case, the counterelectrode 84 is allowed to float electrically thereby producing a capacitor structure of two independent capacitors in series (base-dielectric-common counterelectrode-dielectric-base). Such a configuration has defect tolerance advantages in that a short between one of the pattered pieces 83a and 83b of the bottom electrode and the counterelectrode 84 does not create a short between complementary power supply voltage conductors.

In general, decoupling capacitor configurations such as those described above can be formed at the back end of the wafer processing, e.g., after the last interconnect metal. Such a capacitor can include a thin film base layer (e.g., layer 63, 73 or 83a/83b) of a metal that forms a good quality dielectric film (such as an oxide), followed by a dielectric layer (e.g., layer 68, 78 or 88) overcoated with a counterelectrode (e.g., layer 64, 74 or 84) formed of the same metal or of an alternate metal. The lower metal is electrically connected by design to one of the power supplies (e.g., power or ground) and the counterelectrode is electrically connected to the other. An exemplary design uses Niobium (Nb) as the base metal. The top surface of the Nb is anodized to form $Nb_2O_5$ (Niobium Pentoxide). A layer of $Nb_2O_5$ with a thickness of ~0.13 microns can be formed by anodizing with a voltage of ~50 volts. The counterelectrode can then be a further deposited layer of Nb.

In one realization, such a capacitor structure is formed as part of the barrier metal layers used for flip chip bumping, and constituent materials for the metal layers are selected from Tungsten (W), Tantalum (Ta) and Titanium (Ti). In general, metals such as Nb, W, Ta and Ti are preferred because they form oxide and other insulating layers with relatively high dielectric constants (e.g. $Nb_2O_5$ has a dielectric constant of approximately 30), although other materials with similar characteristics are also suitable. In some realizations, high dielectric materials such as Barium Strontium Titanate (BST) and Lead Zinconate Titanate (PZT) are also suitable.

While the invention has been described with reference to various embodiments, it will be understood that these embodiments are illustrative and that the scope of the invention is not limited to them. Many variations, modifications, additions, and improvements of the embodiments described are possible. For example, although exemplary embodiments have been described in which two power supply voltages have been employed, larger numbers of power supply voltages may be employed with suitable modifications including the addition of corresponding metal layers in decoupling capacitor configurations. Furthermore, although embodiments have been described primarily in the context of solder bump chip attachment technology, the invention is not limited thereto. Indeed, based on the description herein, persons of ordinary skill in the art will appreciate suitable variations for other attachment technologies and for combinations of attachment technologies.

While generally unsegmented decoupling capacitor configurations have been illustrated with multiple vias (and in some configurations, multiple connection points) per contiguous electrode portion, other configurations may segment conductive layers so that as few as a single via and/or connection point is associated with each contiguous electrode portion. Also, while power supply voltage pathways (e.g., for first and second power supply voltages) have been illustrated hereinabove as of corresponding or symmetric design, other decoupling capacitor configurations may use dissimilar power supply voltage pathways (e.g., a first via connection points arrayed above the decoupling capacitor and a second on via on-die or package plane conductors). These and other variations, modifications, additions, and improvements may fall within the scope of the invention as defined in the claims which follow and will be appreciated by persons of ordinary skill in the art based on the description herein.

What is claimed is:

1. An integrated circuit chip comprising:
   circuitry defined thereon including device structures and conductive traces for conveying a first power supply voltage, a second power supply voltage, and signal voltages;
   a thin-film capacitor formed over said circuitry and electrically coupled thereto;
   conductive vias formed at least partially through said thin-film capacitor from respective of said conductive traces,
   each of a first group of said conductive vias electrically connected to a first conductive plate of said thin-film capacitor and perforating, without connecting to, a second conductive plate of said thin-film capacitor, and
   each of a second group of said conductive vias electrically connected to said second conductive plate and perforating, without connecting to, said first conductive plate.

2. An integrated circuit chip as recited in claim 1, further comprising
   plural connection points defined thereon; and
   conductive vias formed through said thin-film capacitor from said connection points to respective signal voltage conveying ones of said conductive traces, said conductive vias perforating, without connecting to, conductive plates of said thin-film capacitor.

3. An integrated circuit chip as recited in claim 1,
   wherein said thin-film capacitor includes more than one plate associated with said first power supply voltage and more than one plate associated with said second power supply voltage; and
   wherein said plates respectively associated with said first and said second power supply voltages are interleaved with respect to each other.

4. An integrated circuit chip as recited in claim 1,
   wherein said thin-film capacitor includes at least one plate respectively associated with at least one other power supply voltage.

5. An integrated circuit chip as recited in claim 1, wherein a dielectric layer formed between at least first and second plates of said thin-film capacitor comprises at least one of barium strontium titanate and lead ziconate titanate.

6. An integrated circuit chip comprising:
   circuitry defined thereon including device structures and conductive traces for conveying a first power supply voltage, a second power supply voltage, and signal voltages;
   a thin-film capacitor formed over said circuitry and electrically coupled thereto;
   conductive vias formed at least partially through said thin-film capacitor from respective of said conductive traces,
   each of a first group of said conductive vias electrically connected to a first conductive plate of said thin-film capacitor and perforating, without connecting to, a second conductive plate of said thin-film capacitor,
   each of a second group of said conductive vias electrically connected to said second conductive plate; and
   plural connection points defined thereon, wherein at least a portion of said first group of conductive vias extend to respective of said connection points, and wherein at least a portion of said second group of said conductive vias perforate, without connecting to, said first conductive plate and extend to respective of said connection points.

7. An integrated circuit chip comprising:
   circuitry defined thereon including device structures and conductive traces for conveying a first power supply voltage, a second power supply voltage, and signal voltages;
   a thin-film capacitor formed over said circuitry and electrically coupled thereto; and
   plural connection points defined thereon, said thin-film capacitor disposed between, but not electrically coupled between, said connection points and said circuitry.

8. An integrated circuit chip comprising:
   circuitry defined thereon including device structures and conductive traces for conveying a first power supply voltage, a second power supply voltage, and signal voltages;
   a thin-film capacitor formed over said circuitry and electrically coupled thereto;
   plural connection points defined thereon; and
   first and second groups of conductive vias formed through said thin-film capacitor from respective of said connection points to respective first and second power supply voltage conveying ones of said conductive traces.

9. An integrated circuit chip as recited in claim 8,
   wherein conductive vias of said first and said second groups perforated, without connecting to, respective conductive plates of said thin-film capacitor.

10. An integrated circuit chip as recited in claim 8, further comprising:
    said first conductive vias connecting to at least a first conductive plate of said thin-film capacitor and perforating, without connecting to, at least a second conductive plate of said thin-film capacitor; and
    said second conductive vias connecting to at least said second conductive plate and perforating, without connecting to, at least said first conductive plate.

11. An integrated circuit chip as recited in claim 8, further comprising:
    a third group of conductive vias formed through said thin-film capacitor from respective of said connection points to respective signal voltage conveying ones of said conductive traces, said third conductive vias perforating, without connecting to, conductive plates of said thin-film capacitor.

12. An integrated circuit chip comprising:
    circuitry defined thereon including conductive traces for conveying a first power supply voltage, a second power supply voltage, and signal voltages;
    a thin-film capacitor structure defined over said circuitry;
    plural connection points defined over said thin-film capacitor, wherein said thin-film capacitor is interposed between said conductive traces and said connection points; and
    conductive vias formed through said thin-film capacitor structure from respective of said conductive traces to respective of said connection points,
    each of a first group of said conductive vias electrically connected to a first conductive plate of said thin-film capacitor structure and perforating, without connection to, a second conductive plate of said thin-film capacitor structure, and
    each of a second group of said conductive vias electrically connected to said second conductive plate and perforating, without connecting to, said first conductive plate.

13. An integrated circuit chip, as recited in claim 12,
wherein said first group of conductive vias is electrically connected between various of said conductive traces conveying said first power supply voltage and respective of said connection points; and
wherein said second group of conductive vias is electrically connected between various of said conductive traces conveying said second power supply voltage and respective of said connection points.

14. An integrated circuit chip, as recited in claim 13, further comprising a third group of said conductive vias perforating, without connecting to, said first and said second conductive plates;
wherein said third group of conductive vias is electrically connected between various of said conductive traces conveying said signal voltages and respective of said connection points.

15. An integrated circuit chip, as recited in claim 12,
wherein said thin-film capacitor structure is substantially coextensive with a surface of said integrated circuit chip.

16. An integrated circuit chip, as recited in claim 12 wherein said connection points include solder bumps.

17. An integrated circuit chip comprising:
circuitry defined thereon including conductive traces for conveying a first power supply voltage, a second power supply voltage, and signal voltages;
a thin-film capacitor structure defined over said circuitry; and
plural connection points defined over said thin-film capacitor; wherein said thin-film capacitor is interposed between said conductive traces and said connection points,
wherein said thin-film capacitor structure includes at least two substantially co-extensive electrodes separated by a dielectric layer;
wherein a first of said electrodes is connected, via plural electrical paths, to a first group of said conductive traces conveying said first power supply voltage, and wherein said first electrode is further connected to a first group of said connection points via plural electrical paths that perforate, without coupling to, a second of said electrodes; and
wherein said second electrode is connected, via plural electrical paths that perforate without coupling to said first electrode, to a second group of said conductive traces conveying said second power supply voltage, and wherein said second electrode is further connected to a second group of said connection points via plural electrical paths.

18. An integrated circuit chip comprising:
circuitry defined thereon including conductive traces for conveying a first power supply voltage, a second power supple voltage, and signal voltages;
a thin-film capacitor structure defined over said circuitry; and
plural connection points defined over said thin-film capacitor, wherein said thin-film capacitor is interposed between said conductive traces and said connection points,
wherein said thin-film capacitor structure includes first and second conductive layers with a dielectric layer formed therebetween;
wherein said first conductive layer is patterned to define first and second distinct electrode regions; and
wherein said second conductive layer includes a common electrode region electrically disposed between said first and second distinct electrode regions to define a series capacitor configuration robust to a short circuit between any two of said first, said second and said common electrode regions.

19. An apparatus comprising:
circuitry including power supply voltage conductors defined on an integrated circuit chip;
power supply voltage connection points defined above said circuity on an upper surface of said integrated circuit chip; and
a decoupling capacitor integral with said integrated circuit chip electrically and physically interposed between said conductors and said connection points; and
first and second groups of conductive vias for conveying respective first and second power supply voltages from respective of said power supply voltage connection points to respective of said power supply voltage conductors,
wherein the conductive vias of said first group and the conductive vias of said second group each perforate, without connecting to, a respective conductive plate of said decoupling capacitor.

20. An apparatus, as recited in claim 19, wherein at least a portion of said circuitry defines a microprocessor.

21. An apparatus, as recited in claim 19, wherein at least a portion of said circuitry defines a semiconductor memory.

22. An apparatus, as recited in claim 19, further comprising:
an integrated circuit package electrically coupled to said circuitry via said connection points.

23. An apparatus, as recited in claim 19, further comprising:
an integrated circuit package; and
a circuit board for an electronic system including a power supply, wherein said circuitry is electrically coupled to said power supply via a power supply loop circuit including said decoupling capacitor integral with said integrated circuit chip and including said connection points, said integrated circuit package and said circuit board.

24. An apparatus as recited in claim 23, further comprising
additional decoupling capacitance distributed off said integrated circuit chip throughout said power supply loop circuit.

25. An apparatus as recited in claim 23, further comprising
a daughter card assembly housing said integrated circuit chip and said integrated circuit package.

26. An apparatus, as recited in claim 19, wherein
the conductive vias of said first group connect to a first conductive plate of said decoupling capacitor and perforate, without connecting to, a second conductive plate of said decoupling capacitor; and
the conductive vias of said second group connect to the second conductive plate and perforate, without connecting to, the first conductive plate.

27. An apparatus, as recited in claim 19,
wherein said decoupling capacitor includes first and second conductive plates respectively associated with the first and second power supply voltages; and
wherein the conductive vias of said first and second groups perforate, without connecting to both the first and the second conductive plates.

28. An apparatus, as recited in claim 19, further comprising:

conductive signal vias that perforate, without connecting to each conductive plate of said decoupling capacitor.

29. An on-chip decoupling capacitor configuration comprising:

first and second conductive layers having a thin-film dielectric defined therebetween and formed above circuits of an integrated circuit chip;

conductive vias formed through planes defined by said first and said second conductive layers and providing conductive paths from said circuits to interconnect attach points defined on an upper surface of said integrated circuit chip over said first and said second conductive layers, a first group of said conductive vias coupling to said first conductive layer and perforating said second conductive layer without coupling thereto, a second group of said conductive vias coupling to said second conductive layer and perforating said first conductive layer without coupling thereto.

30. An on-chip decoupling capacitor configuration, as recited in claim 29, further comprising:

a third group of said conductive vias perforating said first and said second conductive layers without coupling thereto.

31. An on-chip decoupling capacitor configuration, as recited in claim 29, wherein said conductive layers are substantially co-extensive with an entire surface area of said integrated circuit chip.

32. An on-chip decoupling capacitor configuration, as recited in claim 29, wherein said conductive layers are substantially co-extensive with a surface area of said integrated circuit chip having said circuits defined therebelow.

33. An integrated circuit package configuration comprising:

a thin-film capacitor;

conductive vias formed at least partially through said thin-film capacitor and extending to first connection points on a lower surface thereof for coupling to corresponding second connection points of an integrated circuit chip, each of a first group of said conductive vias electrically connected to a first conductive plate of said thin-film capacitor and perforating, without connecting to, a second conductive plate of said thin-film capacitor, and each of a second group of said conductive vias electrically connected to said second conductive plate and perforating, without connecting to, said first conductive plate.

34. An integrated circuit chip package configuration as recited in claim 33, further comprising:

a conductive pathway including said thin-film capacitor for supplying at least one power supply voltage to said an integrated circuit chip.

35. An integrated circuit chip package configuration as recited in claim 33, further comprising:

a conductive pathway independent of said thin-film capacitor for supplying at least one power supply voltage to said an integrated circuit chip.

36. An integrated circuit chip package configuration as recited in claim 33, further comprising:

third connection points interspersed amongst said first connection points for coupling to corresponding fourth connection points of an integrated circuit chip and to convey signal voltages therebetween when coupled.

37. An integrated circuit chip package configuration as recited in claim 36, further comprising a third group of said conductive vias, each of said third group formed through said thin-film capacitor from respective signal voltage conveying conductive traces to respective of said third connection points, said third conductive vias perforating, without connecting to, conductive plates of said thin-film capacitor.

* * * * *